US007989388B2

(12) United States Patent
Incorvia et al.

(10) Patent No.: US 7,989,388 B2
(45) Date of Patent: Aug. 2, 2011

(54) RESIN BONDED SORBENT

(75) Inventors: Samuel A. Incorvia, North Tonawanda, NY (US); Thomas Powers, Mayville, NY (US)

(73) Assignee: Multisorb Technologies, Inc., Buffalo, NY (US)

( * ) Notice: Subject to any disclaimer, the term of this patent is extended or adjusted under 35 U.S.C. 154(b) by 597 days.

(21) Appl. No.: 11/635,750

(22) Filed: Dec. 7, 2006

(65) Prior Publication Data

US 2008/0207441 A1 Aug. 28, 2008

Related U.S. Application Data

(63) Continuation-in-part of application No. 11/335,108, filed on Jan. 19, 2006, now Pat. No. 7,595,278, which is a continuation-in-part of application No. 11/040,471, filed on Jan. 21, 2005.

(51) Int. Cl.
B01J 20/26 (2006.01)
(52) U.S. Cl. .................. 502/402; 502/439
(58) Field of Classification Search .............. 502/401, 502/402, 417, 439
See application file for complete search history.

(56) References Cited

U.S. PATENT DOCUMENTS

| | | |
|---|---|---|
| 3,025,233 A | 3/1962 | Figert |
| 3,091,550 A | 5/1963 | Doying |
| 3,375,933 A | 4/1968 | Rodman |
| 3,454,502 A | 7/1969 | Hiltgen et al. |
| 3,538,020 A | 11/1970 | Heskett et al. |
| 3,545,622 A | 12/1970 | Sakhnovsky |
| 3,687,297 A | 8/1972 | Kuhn et al. |
| 3,704,806 A | 12/1972 | Plachenov et al. |
| 3,833,406 A | 9/1974 | White |
| 4,013,566 A | 3/1977 | Taylor |
| 4,109,431 A | 8/1978 | Mazzoni et al. |
| 4,447,565 A | 5/1984 | Lula et al. |
| 4,547,536 A | 10/1985 | Nabors |
| 4,769,053 A | 9/1988 | Fisher |
| 4,833,181 A | 5/1989 | Narukawa et al. |
| 4,864,071 A | 9/1989 | Hirai et al. |
| 5,078,909 A | 1/1992 | Shigeta et al. |
| 5,079,287 A | 1/1992 | Takeshi et al. |
| 5,114,584 A | 5/1992 | Sheckler et al. |
| 5,346,645 A | 9/1994 | Omure et al. |
| 5,432,214 A | 7/1995 | Lancesseur |
| 5,505,892 A | 4/1996 | Domme |
| 5,591,379 A | 1/1997 | Shores |
| 5,684,094 A | 11/1997 | Suzuki et al. |
| 5,911,937 A | 6/1999 | Hekal |
| 5,966,810 A | 10/1999 | Chisnell et al. |
| 6,059,860 A | 5/2000 | Larson |
| 6,080,350 A | 6/2000 | Hekel |
| 6,103,141 A | 8/2000 | Incorvia et al. |
| 6,124,006 A | 9/2000 | Hekal |
| 6,133,193 A | 10/2000 | Kajikawa et al. |
| 6,167,720 B1 | 1/2001 | Chisnell |
| 6,187,269 B1 | 2/2001 | Lancesseur et al. |
| 6,214,255 B1 | 4/2001 | Hekal |
| 6,316,520 B1 | 11/2001 | Hekal |
| 6,318,115 B1 | 11/2001 | Kirchner et al. |
| 6,430,958 B1 | 8/2002 | Corrigan et al. |
| 6,438,972 B1 | 8/2002 | Pickett, Jr. et al. |
| 6,457,294 B1 | 10/2002 | Virnelson et al. |
| 6,460,271 B2 | 10/2002 | Hekal |
| 6,465,532 B1 | 10/2002 | Hekal |
| 6,493,960 B2 | 12/2002 | Taylor et al. |
| 6,562,452 B2 | 5/2003 | Ferri |
| 6,568,204 B2 | 5/2003 | Fisk et al. |
| 6,569,532 B2 | 5/2003 | Tomiyoshi et al. |
| 6,605,476 B2 | 8/2003 | Kobayashi |
| 6,613,405 B1 | 9/2003 | Hekal |

(Continued)

FOREIGN PATENT DOCUMENTS

| | | |
|---|---|---|
| CA | 2592583 | 7/2006 |
| EP | 0 176 083 | 4/1986 |
| EP | 0 400 460 | 12/1990 |
| EP | 0 596 677 | 5/1994 |
| EP | 1 000 873 | 11/2003 |
| EP | 1000873 B1 | 11/2003 |
| EP | 0892673 B1 | 2/2004 |
| FR | 2660634 | 10/1991 |
| GB | 1313348 | 4/1973 |
| GB | 1316623 | 5/1973 |
| JP | 02107312 | 4/1990 |
| WO | WO 00/09848 | 2/2000 |
| WO | WO02/50178 A1 | 6/2002 |
| WO | WO03/013843 A1 | 2/2003 |
| WO | WO03/016037 A1 | 2/2003 |
| WO | WO03/086900 A1 | 10/2003 |
| WO | WO2004/000703 A1 | 12/2003 |
| WO | WO 2004/019421 | 3/2004 |
| WO | WO2004/033320 A2 | 4/2004 |
| WO | WO2004/033339 A1 | 4/2004 |
| WO | WO2004/034024 A2 | 4/2004 |

OTHER PUBLICATIONS

Staton, B.S., JoAnna Christen. "Heat and Mass Transfer Characteristics of Desiccant Polymers", Thesis Paper Submitted to the Faculty of the Virginia Polytechnic Institute and State University, Blacksburg, Virginia, May 1998.

(Continued)

*Primary Examiner* — Edward M Johnson
(74) *Attorney, Agent, or Firm* — Simpson & Simpson, PLLC

(57) ABSTRACT

The invention relates to improved resin bonded sorbent compositions and articles of manufacture fabricated therewith, such as housings, structural components and circuit boards. The introduction of sorbents into resinous molding compositions enables the elimination of more conventional bagged sorbent containments. The novel molding compositions of the invention and parts fabricated therewith are multi-functional, beneficially combining structural, mechanical and adsorptive capabilities without requiring the usual reinforcing additives. Consequently, with the omission of reinforcing additives the novel molding compositions of the invention are further characterized by higher adsorptive capacities by allowing for higher sorbent loading factors than prior adsorbent-containing molding compositions.

40 Claims, 6 Drawing Sheets

U.S. PATENT DOCUMENTS

| | | |
|---|---|---|
| 6,615,609 B2 | 9/2003 | Kawasaki et al. |
| 6,617,381 B1 | 9/2003 | Kumaki et al. |
| 6,688,468 B2 | 2/2004 | Waterman |
| 6,705,463 B1 | 3/2004 | Bucholtz et al. |
| 6,740,145 B2 | 5/2004 | Boroson et al. |
| 6,769,558 B1 | 8/2004 | Bucholtz |
| 6,883,938 B1 | 4/2005 | Kohara et al. |
| 6,887,924 B2 | 5/2005 | McKedy et al. |
| 7,005,459 B2 | 2/2006 | Hekal |
| 2003/0079772 A1 | 5/2003 | Gittings et al. |
| 2005/0089687 A1 | 4/2005 | Judek et al. |
| 2006/0079657 A1 | 4/2006 | Incorvia |
| 2006/0166819 A1 | 7/2006 | Powers et al. |

OTHER PUBLICATIONS

Staton, JoAnna Christen, "Heat and Mass Transfer Characteristics of Desiccant Polymers,", B.S. Virginia Polytechnic Institute and State University, Blacksburg, Virginia, May (1988).

Pehlivan, H. et al. "Water and Water Vapor Sorption Studies in Polypropylene-Zeolite Composites", Chemical Engineering Dept., Izmir Institute of Technology, Izmir, Turkey 35437 (2003).

_US 7,989,388 B2_

RESIN BONDED SORBENT

CROSS REFERENCE TO RELATED APPLICATIONS

This application is a Continuation-in-Part of application Ser. No. 11/335,108, filed on Jan. 19, 2006, now U.S. Pat. No. 7,595,278 which application is a Continuation-in-Part of application Ser. No. 11/040,471, filed Jan. 21, 2005.

FIELD OF THE INVENTION

The present invention relates generally to articles protected by sorbents, and more particularly, to improved injection molding compositions and articles of manufacture fabricated therefrom comprising adsorbing additives in a resinous base.

BACKGROUND OF THE INVENTION

Incorporation of sorbents, e.g., desiccants, into resin matrices has been revealed in several contexts. Formation of these resins into structural or functional shapes by various processes has been described in certain applications. Similarly, fillers have been added to structural molding resins. Low cost mineral or other fillers have been added to resin-containing compositions to extend the resin and reduce costs, while maintaining strength sufficient for the intended end-use application of the molded article. It is also a frequent practice to add reinforcing materials, such as glass fibers or beads to enhance mechanical properties of molding resins, e.g., hardness, tensile displacement, and so on. With reinforcing additives, just as with fillers, it has been found there are ranges within which the desired effects of extending the resin or reinforcing the molded article are accomplished while maintaining satisfactory injection molding and mechanical properties.

Nevertheless, molding compositions comprising reinforcing additives have not been entirely satisfactory for a number of end-use applications. For example, a molding composition having relatively high loading levels of reinforcing additives, such as glass fibers and glass beads have the affect of limiting the loading factor of sorbent additives which may be introduced into such molding compositions for optimal adsorption performance. However, with a corresponding reduction in the loading of reinforcing additives and an increase in the loading of sorbent additives, there was also a potential for a reduction in desirable mechanical properties, such as hardness, tensile strength, and other mechanical properties.

Thus, existing resin/sorbent matrices suffer from several drawbacks. The materials are often brittle and insufficient to survive standard drop testing. Additionally, particulate material may be released from the matrices thereby degrading part performance and/or device functionality. Due to the structure of these matrices, water may be adsorbed or absorbed at a faster rate, which in fact may be too fast for common manufacturing procedures. In other words, the ability for a part to adsorb water may be exhausted prior to its assembly in a device because environmental conditions are not controlled in the manufacturing area. Existing resin/sorbent matrices are often quite expensive to manufacture and use due to the use of exotic resin, additional processing steps and the use of multi-resin materials having phase boundaries. Additionally, existing resin/sorbent matrices may pose compatibility issues due to materials typically used as binders.

Accordingly, there is a need for improved resinous molding compositions, and more particularly, injection molding compositions and articles of manufacture made therefrom, wherein the compositions and manufactured articles retain high loading levels of sorbent additives without off-setting desirable mechanical properties of the resins.

BRIEF SUMMARY OF THE INVENTION

It is therefore a principal object of the invention to provide improved multifunctional resinous molding compositions with a high level of adsorbing properties with enhanced mechanical properties.

The present invention broadly comprises an article including a resin bonded sorbent material for at least one fluid in combination with a second article needing protection from the at least one fluid, the resin bonded sorbent material including a blend of resin and a sorbent for the at least one fluid and the at least one fluid is destructive to the second article, wherein all of said resin is homogeneous resin. The resin may be a thermoplastic resin and the sorbent may be selected from the group consisting of a molecular sieve, silica gel, an ion exchange resin, activated carbon, activated alumina, clay, particulate metal, a salt comprising a $CO_2$ releasing anion and mixtures thereof. Alternatively, the sorbent material may be a zeolite. The at least one fluid may be selected from the group consisting of a caustic fluid, an organic solvent fluid, an inorganic solvent fluid, a Group VI fluid and a Group VII fluid.

In one embodiment, the sorbent is a molecular sieve and the resin is selected from the group consisting of polyamide, polyolefin, styrenic polymer, polyester and homogeneous mixtures thereof. In another embodiment, the resin is an ethylene or a propylene-containing homopolymer or copolymer. The resin bonded sorbent material may be formed with the aid of a coupling agent or a compatibilizing agent, wherein the coupling agent or compatibilizing agent is chemically compatible with the resin and improves adhesion or coupling with the sorbent, with the purpose of uniformly dispersing the individual sorbent particles so that each is fully surrounded by resin. In an embodiment, the coupling or compatibilizing agent is selected from the group consisting of reactive and non-reactive agents. In a further embodiment, the compatibilizing agent is selected from the group consisting of a metal, an acrylate, stearate, block copolymer, maleate, epoxy, silane, titanate and mixtures thereof. In one embodiment, the resin bonded sorbent material comprises from about five percent (5%) to about fifty-five percent (55%) sorbent and from about forty-five percent (45%) to about ninety-five percent (95%) resin. In another embodiment, the resin bonded sorbent material comprises from about twenty-five percent (25%) to about fifty-five percent (55%) sorbent and from about forty-five percent (45%) to about seventy-five percent (75%) resin. In yet another embodiment, the resin bonded sorbent material comprises from about thirty-five percent (35%) to about forty-two percent (42%) sorbent and from about fifty-eight percent (58%) to about sixty-five percent (65%) resin.

In another embodiment of the present invention, the sorbent comprises a particulate sorbent formed by pressing, sintering or molding, and said sorbent further comprises at least a partial overmold of said resin. The article may further include means for mounting within or attaching to said second article. The means for mounting or attaching may include at least one tab, while the molding may include the use of heat and/or pressure. In still another embodiment, the present invention may include an electrically conductive material, and in yet another embodiment, the resin bonded sorbent material includes a single resin.

The invention further relates to an article including a resin bonded sorbent material for at least one fluid, the resin bonded sorbent material includes a blend of a resin and a sorbent for the at least one fluid, the resin bonded sorbent material having a vapor permeability greater than the vapor permeability of water through high density polyvinylidene chloride and less than the vapor permeability of water through water swellable water insoluble hydroxycellulose.

Still another aspect of the present invention comprises a method for protecting a first article from at least one fluid damaging the first article, the method comprising the steps of: i) forming a resin bonded sorbent material, the resin bonded sorbent material comprising a blend of a resin and a sorbent for the at least one fluid; ii) forming a second article from the resin bonded sorbent material; and, iii) incorporating the second article into the first article.

It is still a further principal object of the invention to provide an article of manufacture fabricated entirely or partially from the resin bonded sorbent compositions as disclosed herein. The present invention article may be selected from the group consisting of a lens, circuit board, housing, case, frame, support structure, mount structure, retaining structure, seal material, solid state surface mount device, electronic chip packaging, telecommunications terminal, telecommunications switch, a data storage device, electronic device, electro-optical device, scope, sensor, transmitter, antenna, radar unit, photovoltaic device, radio frequency identification device, light emitting diode, liquid crystal diode, semiconductor enclosure, imaging device, sighting device, cellular phone, target acquisition and guidance sensor, implantable electronic medical device, attached electronic medical device, mobile telecommunications device, stationary telecommunications device, automobile sensing circuit, automobile control circuit, braking control system, hazardous chemical sensor, hazardous chemical control, gauge, electronic display, personal computer, programmable logic unit, medical diagnostic equipment, light sensor, motion sensor, heat sensor, security camera, flexible electronic device, lighting fixture, marine gauge, marine light, external aircraft sensing device, external aircraft monitoring device, external aircraft measuring device, power tool sensing device, power tool sighting device, power tool measuring device, laser and combinations thereof.

For purposes of this invention the expression "resin bonded sorbent", as appearing in the specification and claims, is intended to mean a surface compatibility occurring between the sorbent and the resin through a loss of crystallinity of the resin, whereby the sorbent becomes wetted and miscible with the resin due to a reduction in surface tension. The expression "resin bonded sorbent" is intended to include binding between the resin and sorbent, which can occur, for example, through heating the sorbent with the resin, or which can be bound through suitable, non-contaminating coupling, surfactant or compatibilizing agents, discussed in greater detail below. Additionally, the term "resin" as used in blends of resin/sorbent material means the resin in the matrix, whereas "sorbent" means the material actually adsorbing or absorbing contaminants which may itself be a polymeric or resinous material.

BRIEF DESCRIPTION OF THE DRAWINGS

The features of the invention believed to be novel and the elements characteristic of the invention are set forth with particularity in the appended claims. The figures are for illustration purposes only and are not necessarily drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 2:
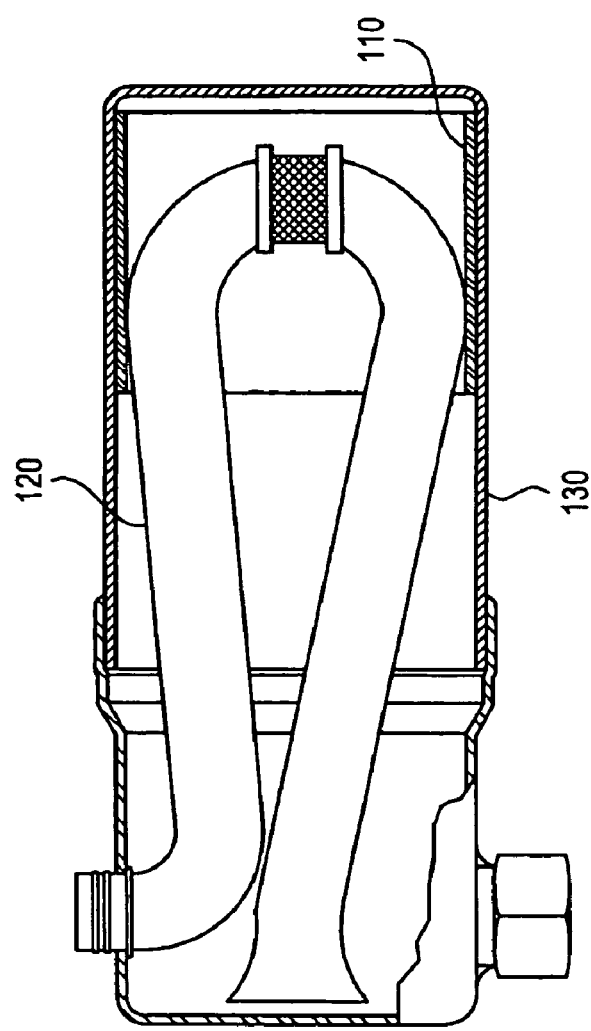
FIG. 2 is a partial cross sectional side view of an accumulator in accordance with the present invention.

As one of ordinary skill in the art appreciates, the term "fluid" is defined as an aggregate of matter in which the molecules are able to flow past each other without limit and without fracture planes forming. "Fluid" can be used to describe, for example, liquids, gases and vapors. Additionally, a salt of a $CO_2$ releasing anion as used herein refers to any salt that will release $CO_2$ vapor upon contact with an acid stronger than carbonic acid, e.g., carbonates and bicarbonates. The permeability of water vapor through high density polyvinylidene chloride is herein defined as impermeable, while the permeability of water vapor through water swellable water insoluble hydroxycellulose is herein defined as substantially permeable. Water swellable water insoluble hydroxycellulose as used herein is intended to mean cellulose with sufficient hydroxy substitution to be water swellable to an extent of fifteen percent (15%), but insufficient to cause water solubility. "Vapor permeability" as used herein refers to the rate of permeability as described above, independent of the actual permeability of any vapor or gas, except water, through high density polyvinylidene chloride or water swellable water insoluble hydroxycellulose. When the term "permeable" or "impermeable" is used herein, it is intended to refer to transfer of fluid through a material either through pores therein or at a molecular level.

It would be desirable for reasons of cost and productivity to incorporate a sorbent into a resin, and in particular one suitable for injection molding, in such a way that its adsorptive properties are preserved and the molding properties of the resin are maintained without degrading mechanical properties. Surprisingly, the novel molding compositions of the invention and parts fabricated therewith are multi-functional, beneficially combining structural, mechanical and adsorptive capabilities without requiring the usual reinforcing additives. Consequently, with the omission of reinforcing additives the novel molding compositions of the invention are further characterized by higher moisture adsorptive capacities by allowing for higher sorbent loading factors than prior adsorbent-containing molding compositions.

Serendipitously, it was discovered as a part of the present invention, that sorbents of the "resin bonded sorbent" molding compositions have the beneficial effect of imparting reinforcement to the molding compositions of the invention while retaining their moisture adsorptive capacity, but without requiring the usual and customary strengthening additives, such as glass beads, glass fiber, and the like. This allows for higher loading factors of sorbent additives for maximizing adsorptive properties of the molding composition without trade-offs occurring in terms of significantly altered mechanical properties of the molding composition.

While the present invention relates principally to the discovery that the mechanical properties of molding resins comprising sorbent additives are capable of eliminating the usual requirement specifically for reinforcement additives, such as glass beads and glass fibers, the invention also contemplates multifunctional sorbent-resin molding compositions comprising moisture adsorbing-mechanical property enhancing amounts of adsorbent in combination with reinforcing additives and resin, wherein reduced amounts of reinforcing additives can be employed than otherwise normally required for enhanced mechanical properties. That is, the invention also provides desiccant-containing molding compositions, but with reduced quantities of strength enhancing additives, such as glass fibers and glass beads. This will enhance the mechanical properties of the molding composition without the potential for degrading the strength characteristics of the molded article. More specifically, proportional ranges of sorbent, reinforcing additives and resin can be from about 5 to about 50 Wt % sorbent; from about 0 to about 15 wt % reinforcing additive and from about 45 to about 95 wt % resin. Additionally, it has been found that a resin/sorbent matrix having a blowing agent incorporated therein maintains its structural integrity while reducing material density by about 30%.

It has also been found as a part of the present invention that, within limits, the resins can be processed and formed by several techniques, including modern high-speed injection molding processes into fully functional component parts, including parts for various sealed systems and assemblies. In these later applications, the structural and functional features of the inventive concepts are served while ambient and ingressed moisture are adsorbed to protect sensitive materials or components of systems or assemblies from degradation by moisture; e.g. hydrolysis or corrosion.

In accordance with the above, the present invention comprises reinforced structural resin compositions suitable for injection molding with improved mechanical properties, satisfactory melt handling properties, and substantial moisture adsorption properties. Most thermoplastic resins are suitable for use in the resin bonded adsorbent compositions of the invention, and include homopolymers and copolymers comprising two or more monomers. Representative examples include the polyamides, such as Nylon 6; Nylon 6,6; Nylon 610, and so on. Other representative examples include the polyolefins, such as high and low density polyethylenes, polypropylene; copolymers of ethylene-vinyl acetate; polystyrene; polyesters, e.g., PET, to name but a few.

As previously discussed, according to one aspect of the invention, compositions of the present invention may comprise from about 5 to about 55 wt % sorbent and the balance resin, and more specifically, from about 25 to about 45 wt % sorbent with the balance resin. More preferred compositions may comprise from about 35 to about 42 wt % sorbent, such as a molecular sieve, and the balance resin. A most preferred resin bonded sorbent composition may comprise from about 60% nylon molding resin, such as Zytel® 101, commercially available from E.I. duPont, compounded with 40% molecular sieve, such as W. R. Grace 4A molecular sieve powder. The molecular sieves of the invention can have a nominal pore size of 4 Å, and a particle size range of about 0.4 to about 32µ. It is to be noted, however, that other molecular sieve pore-sizes can be used as well, such as 3 Å, 5 Å, or 10 Å, for example.

Generally, sorbents which are useful and functional in this invention are those which bond mechanically to the resin without special additives, such as molecular sieve, as previously discussed. Still others, according to the instant invention, can be induced to bond to the resin through use of a suitable additive, i.e., bind with the aid of a coupling or compatibilizing agent. In addition to molecular sieve, other representative sorbents that are useful in the compositions of the invention include silica gel, activated carbon, activated alumina, clay, other natural zeolites, and combinations thereof. Those sorbents found to perform with coupling or compatibilizing agents include such members as activated carbon and alumina.

The additives which perform as compatibilizers fall into either of two categories, namely those which bond with the resin or the sorbent, and those having some affinity with both resin and sorbent, and act as solid state surfactants. Reactive coupling agents include such classes as maleates, epoxies and silanes. More specifically, reactive coupling agents include such representative examples as maleic anhydride grafted polymers used in amounts ranging from about 2 to about 5 Wt %. In particular, they can include such representative examples as maleic anhydride grafted to polypropylene or ABS resins, the latter being useful as coupling agents with styrenic polymers. Similarly, silanes with various functional groups attached may be used.

The present invention also contemplates the use of so called non-reactive type compatibilizing agents in binding sorbent and resin. This comprises such representative examples as metals (e.g., zinc or sodium), acrylates, stearates and block copolymers, e.g., zinc stearate, sodium stearate in a range from about 0.01 to about 0.02 wt % based of the sorbent. The actual level is driven by the surface area, which is in-turn proportional to the particle size. For a molecular sieve with mean particle size of 10µ, 100 ppm of aluminum stearate would be a typical starting level for compatibilization with a polyamide resin. With both reactive and non-reactive coupling/compatibilizing agents, their incorporation within the resin matrix does not create phase boundaries.

The resin bonded sorbent compositions may be prepared in accordance with the present invention using plastic compounding techniques generally familiar among ordinary skilled artisans. Molecular sieve, a preferred sorbent, may be incorporated into the resin, e.g., polyamide, polyolefin, or the like, by feeding the sorbent in powdered format along with beads of the chosen resin to a plastics extruder with good mixing characteristics. Although single-screw extruders may be used to compound a resin and sorbent, a resin and sorbent blend normally needs to be double-compounded in order to produce a suitable resin bonded sorbent material. Even after double compounding, phase separation sometimes occurs. It has been found that resin bonded sorbent materials compounded with twin-screw extrusion equipment with extensive back mixing is needed to attain nearly complete dispersion of the sorbent and develop the superior mechanical and physical characteristics which are an object of this invention. In other words, resin bonded sorbent materials formed via a twin-screw extruder show little or no migration of sorbent within the resin matrix and thus these resin bonded sorbent materials maintain a homogeneous appearance. Therefore, twin-screw extruder compounding is typically used to form resin bonded sorbent materials of the present invention, as the resin is melted and the sorbent mixed throughout. It is a necessary condition that the melt blend be heated above the melt point of the resin as determined by DSC (differential scanning calorimetry). That is, in preparing the resin bonded sorbents of the invention, the temperature should be raised to the point where all crystallinity is lost in order to achieve complete miscibility of the sorbent in the resin melt. For example, DuPont's Zytel® 101 polyamide resin would be heated above 262° C. The extruded resin is cooled and then cut or crushed into pellets or granules. Because compounding is performed at elevated temperatures, the sorbent tends not to adsorb moisture during this processing period, but retains its adsorption capacity when molded into a component part and installed in a working environment.

One further advantage realized with the resin bonded sorbent system of the present invention, wherein the resin and sorbent are intimately bonded, is that gram for gram it is more effective than adsorbent systems employing a bagged adsorbent, i.e., adsorbent capacity per unit volume. According to earlier methods wherein bags were used for containerizing sorbent, the sorbent required beading to prevent it from entering the refrigerant stream, for example. This required the sorbent to be bonded within a binder resin, typically 15 wt % binder, such as in the form of a powder. Thus, when 40 grams of a commercially prepared sorbent was placed into a bag, in reality only 34 grams of sorbent were introduced into the system (with 6 grams of binder). In contradistinction, the resin bonded sorbents of the present invention require no additional binder resin because the sorbent is placed directly into the molding resin from which the components are fabricated. Advantageously, with the immediate invention, no intermediary binder resin is required, allowing for higher sorbent loading factors than otherwise achieved with the usual bagged sorbents.

Figure 1:
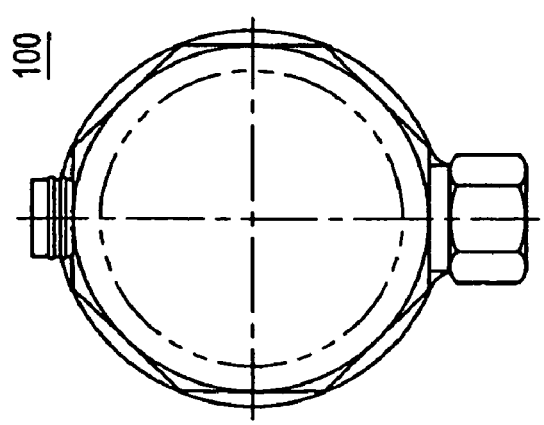
FIG. 1 is an end view of an accumulator in accordance with the present invention.

The compounded resin blend of the invention, previously discussed, can then be extruded into a sheet or film, or injection molded in the form of a part. An exemplary part is a refrigerant vapor liquid separator, such as is used in the receiver of an automotive air conditioning system. The strength of the silicate-reinforced resin results in a structurally sound molded part. As such, it is self-supporting and suitable for mounting in the same ways that metal or plastic refrigeration components are presently mounted. See, for example, FIGS. 1 and 2, which show an end and partial cross sectional side view, respectively, of a U-Tube assembly 100. This embodiment, which uses the composition of the present invention to form a liner or sleeve 110 out of the resin bonded sorbent of the present invention, contains a U-tube 120 within accumulator canister 130. This design provides a means of drying against an exposed inner surface of liner 110. This embodiment is an alternative to a "baffle" type accumulator of the prior art (not shown).

Alternatively, the resin formed in accordance with the present invention, instead of being melted and injection molded into a functional sorbent part, may be milled or otherwise formed or pelletized into pieces which are then sintered into parts, such as a flow-through monolith structure, or a flow-through dryer component, e.g., electronics filtration for a hard drive. In this case, the part is not injection molded, but is molded from the compounded sorbent-loaded resin into a functional part having sufficient porosity for its intended application, such as for use in a receiver dryer assembly.

Parts fabricated from the resin bonded sorbents of the present invention are particularly well suited to replace multiple-component parts of the prior art. For example, in the past many specialized structures have been developed to fit and secure a desiccant material (which was loose) in various parts of a refrigeration system. Welded or sewn bags containing beaded or granular molecular sieve or aluminum oxide would be disposed within a flow path. Additionally, and specifically with respect to stationary refrigeration applications, beads or granules of desiccant were bonded together in a heated mold with a suitable heat-cured resin or ceramic binder to produce a rigid shape which would serve as a drying block or partial filter. Such a structure would be built into a housing. These solutions, however, involved complicated multiple part pieces. The present invention, however, joins the performance of the desiccant with the structural purpose of a part such that a one-piece device serves both functions simultaneously.

Figure 3:
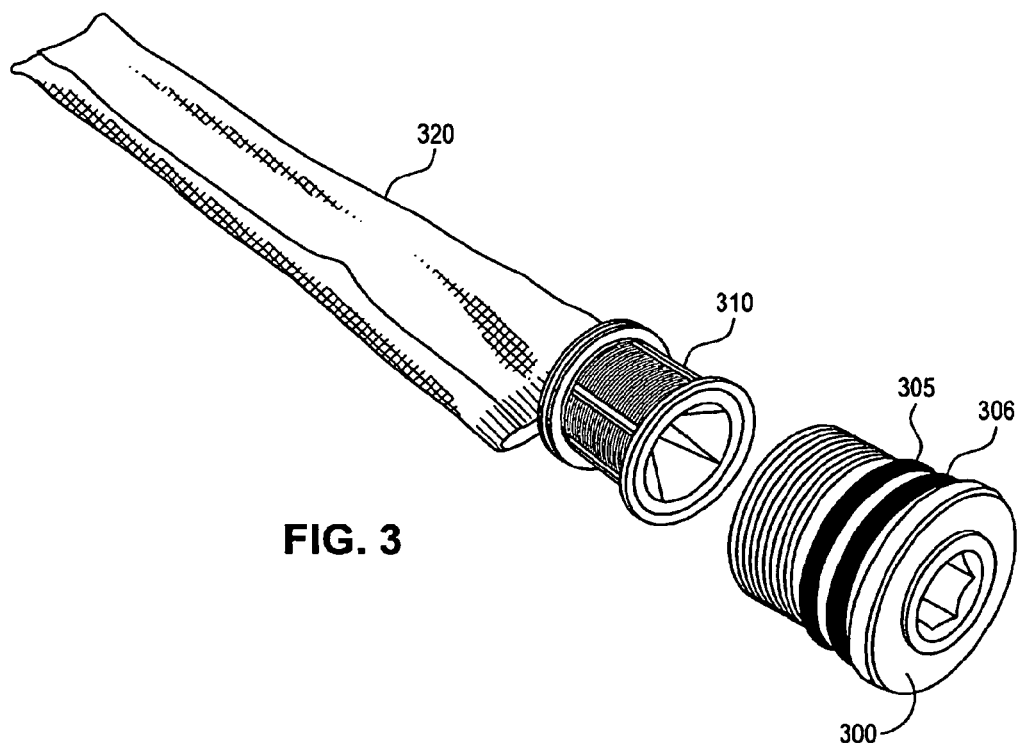
FIG. 3 is an exploded view of a filter/desiccant bag/aluminum fitting component of a refrigeration system in accordance with the prior art.
Figure 4:
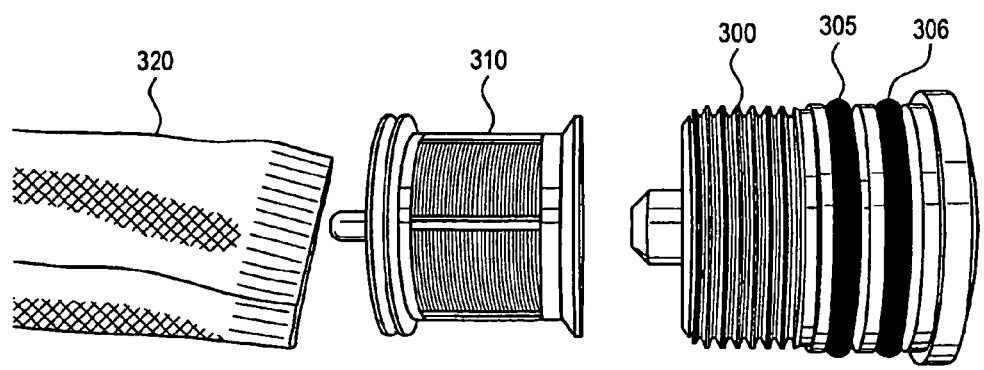
FIG. 4 is a side view of the component of FIG. 3.
Figure 5:
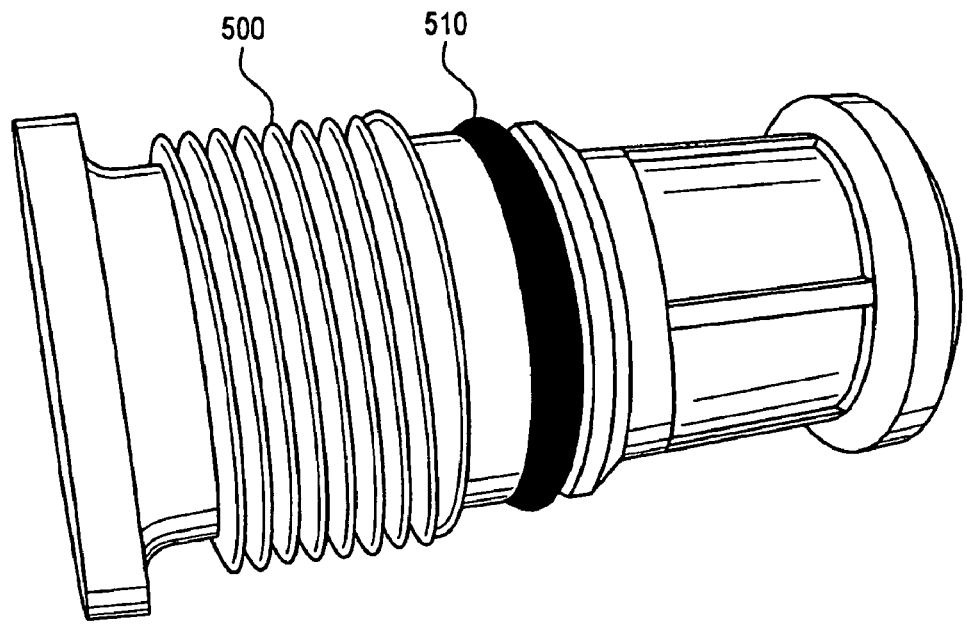
FIG. 5 is a one-piece filter/fitting made in accordance with the composition of the present invention.
Figure 6:
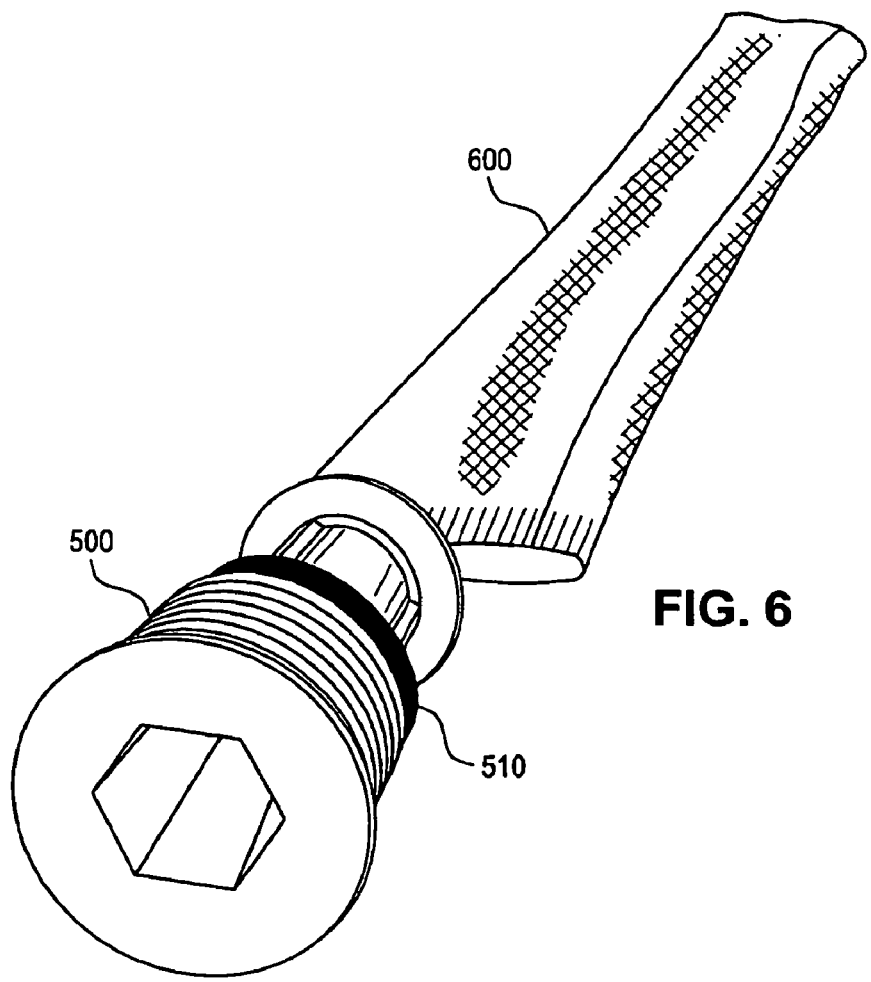
FIG. 6 is an illustration of the use of the device shown in FIG. 5 along with a desiccant bag.
Figure 7:
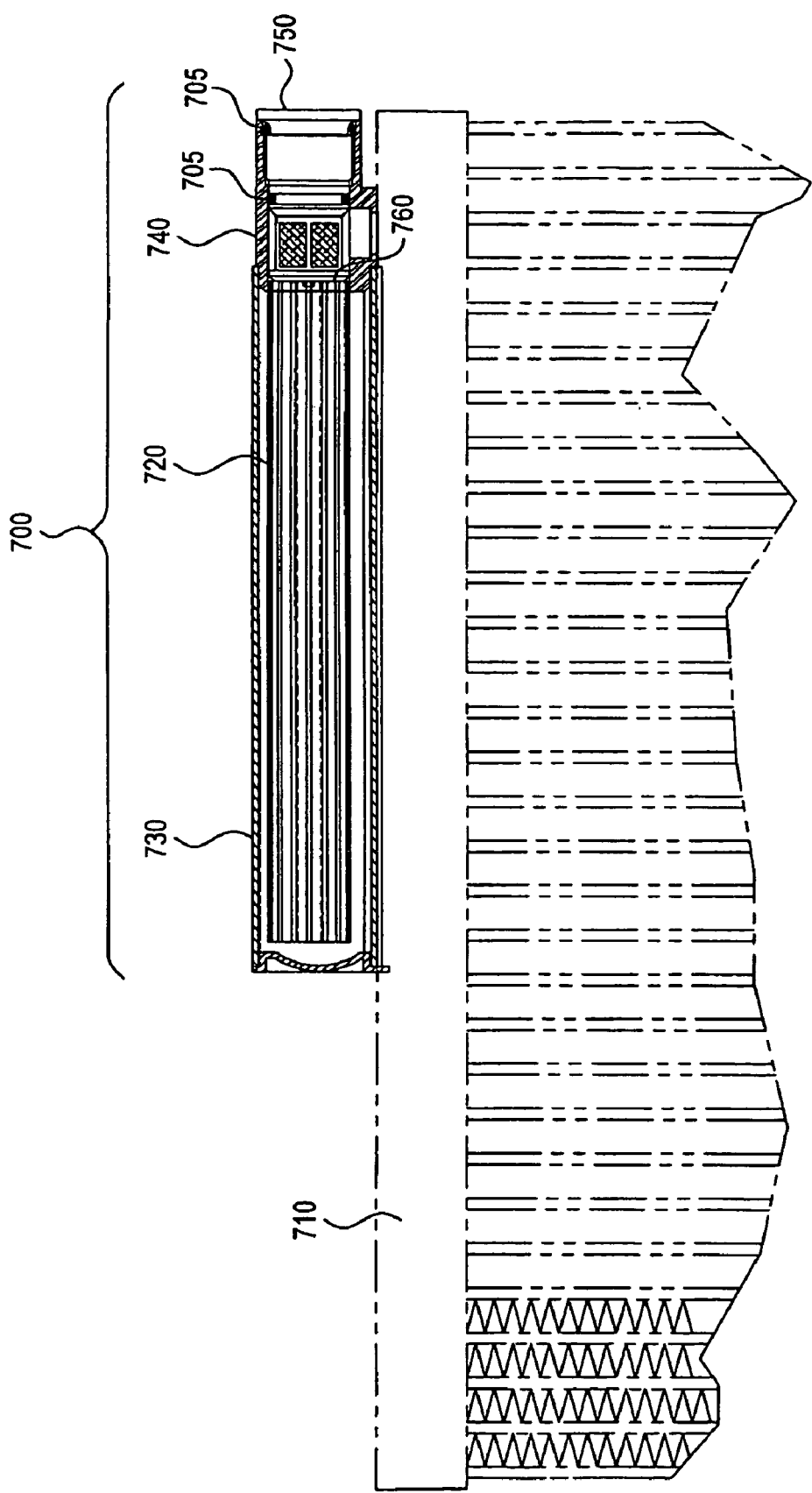
FIG. 7 shows a cross sectional view of an embodiment of the part shown in FIG. 5 in use atop a condenser.

For example, the present invention is contemplated for use with an Integrated Receiver Dehydrator Condenser, such as those which are starting to find their way into a growing number of vehicles. Such mobile refrigeration cycle components basically combine the drying function with the condenser for a number of reasons. It reduces the number of system components, therefore making better use of underhood space, and concomitantly reduces the number of fittings and connections minimizing the potential for system leaks. It also has some performance gains relative to cooling efficiencies. The current technology is illustrated in FIGS. 3 and 4 which show aluminum threaded plug 300 with O-rings 305 and 306, an injection molded filter 310, and desiccant bag 320. By converting this system to a one-piece injection molded plug/filter assembly, such as that shown in FIG. 5, a one piece plug 500 with O-ring 510 can be utilized. In such a case, plug 500 could be assembled with desiccant bag 600 as shown in FIG. 6. FIG. 7 illustrates a partial cross section of the device assembled.

More specifically, FIG. 7 shows the device 700 disposed adjacent condenser 710. Device 700 is comprised of desiccant bag 720 disposed within receiver dryer tube 730. On the end of device 700 is filter tube 740 housing integral threaded plug and filter 750. O-rings 705 are also shown. Desiccant bag 720 is connected to integral threaded plug and filter 750 at interface 760. This design would eliminate all the separate assembly steps and create a part with fewer separate pieces, as compared to the aluminum threaded plug described above.

Figure 9:
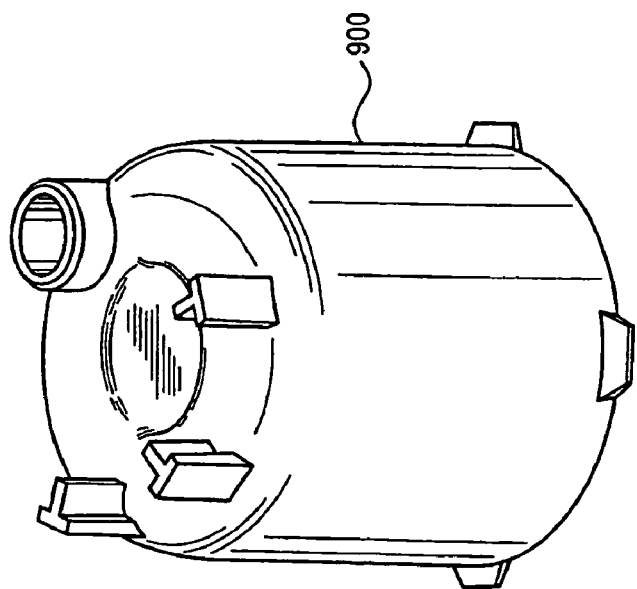
FIG. 9 illustrates a cap portion for the separator of FIG. 8.
Figure 8:
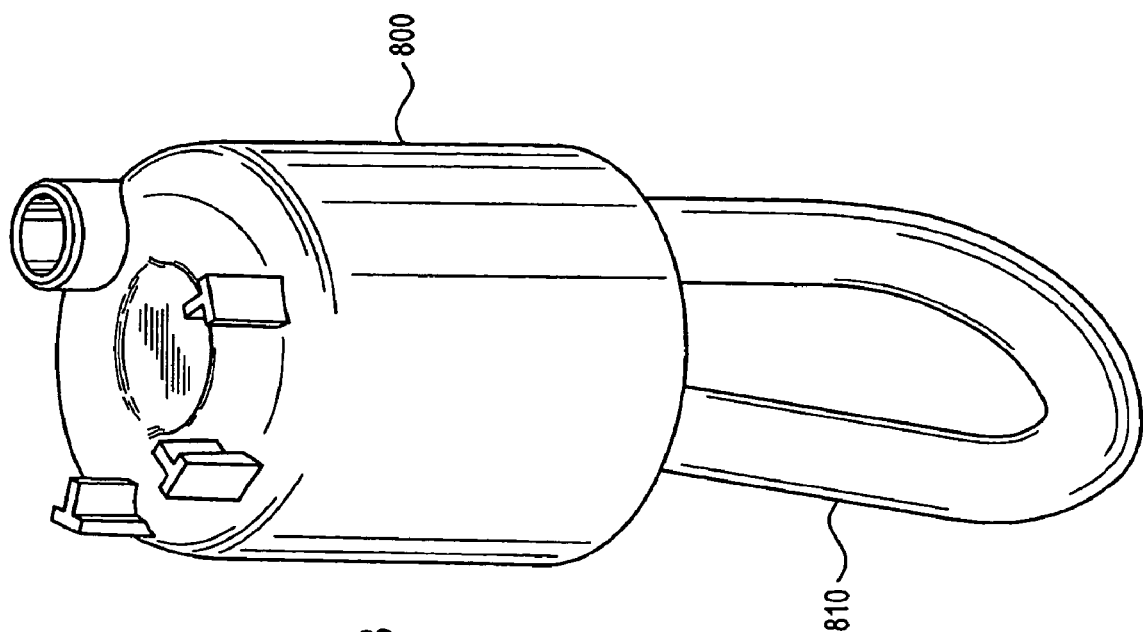
FIG. 8 illustrates a mobile refrigeration accumulator baffle portion of a refrigerant vapor/liquid separator, such as is used in the receive of an automobile air conditioning system, made in accordance with the present invention.

Still another embodiment incorporating the present invention is shown in FIG. 8, which illustrates a mobile refrigeration accumulator upper portion 800 of a refrigerant vapor/liquid separator, such as is used in the receiver of an automobile air conditioning system. As can be seen in FIG. 8, accumulator upper portion 800 contains J-Tube 810 which is mounted within it. In this case, one or both of these pieces are molded from the resin bonded sorbent composition of the present invention. FIG. 9 illustrates cap 900 which would be placed over top accumulator upper portion 800. In a preferred embodiment of such an accumulator apparatus, both upper portion 800 and cap 900 would be injection molded and then welded, or possibly injection blow-molded in halves. Completing the device would be a lower portion (not shown) which could also be molded from the resin bonded sorbent composition of the present invention.

In order to demonstrate the benefits of the resin bonded sorbents of the present invention, the following experiments were performed:

EXAMPLE 1

Test samples of resin bonded sorbents were prepared according to the claimed invention employing the following protocols. The resins are procured from a supplier in pellet form (most common is cylindrical (0.03-0.12 inch diameter× 0.06-0.25 inch long), other forms included tear drop format (0.06-0.19 inch). The ratio of molecular sieve to the resin is determined by weight of the components. The resin was premixed in a poly bag by hand (5-15 min). The pre-blend was emptied into the hopper of a Brabender single screw extruder. Action from the screw further blends and melts the resin and molecular sieve as it travels through the extruder barrel. The resin bonded sorbent then exits through the single strand die (1 circular hole) at the end of the extruder forming one strand of molten material. The nylon based resin was heated above 262° C. The strand was then cooled by air. The strands were broken into pieces. The pieces were placed in a hopper of an injection molding machine and parts molded. The parts were broken into pieces and re-introduced back into the injection molding machine where the tensile specimens (dog bones) were injection molded for testing. Although a single screw extruder was used in this example, as described supra, a twin-screw extruder may also be used to compound a resin and sorbent, and such variations are within the spirit and scope of the claimed invention.

The resin chosen was one known to be compatible with refrigerants used in modern air conditioning systems, specifically R-134a and R-152a. The resin was also compatible with compressor lubricants entrained in the refrigerant stream. The desiccant was the same as that most commonly used in conventional systems, namely a 3A or 4A molecular sieve.

For comparison, a commonly used reinforcing glass bead was compounded at about the same loading. Glass beads are added to a polymer melt to control shrinkage and to uniformly enhance mechanical properties. Glass beads were effective in this application because they bonded mechanically to the resin, so that after molding an isotropic structure resulted.

The compounded resin mechanical properties are compared with the pure polymer and with glass reinforced polymer in Table I.

TABLE I

Properties of Reinforced Nylon

| | Material: | | |
|---|---|---|---|
| Property: | Nylon Neat | Molecular Sieve Reinforced Nylon | Glass Bead Reinforced Nylon |
| Loading (%) | 0 | 36.6 | 38.2 |
| Hardness - Shore D (ASTM D 2440) | 81.4 | 93 | 86.6 |
| Tensile Modulus (psi) (ASTM D 638) | 203779 | 307252 | 361470 |
| Tensile Displacement @ Max Load (in.) (ASTM D 638) | 0.62 | 0.144 | 0.132 |
| Tensile Stress @ Max. Load (psi) (ASTM D 638) | 10907 | 10519 | 10412 |
| Flex Modulus (psi) (ASTM D 790) | 336577 | 439087 | 506988 |
| Flex Displacement @ Yield (in.) (ASTM D 790) | 0.531 | 0.142 | 0.156 |
| Flex Stress @ Yield (psi) (ASTM D 790) | 17114 | 16662 | 15132 |
| Heat Deflection Temp. (° F.) (ASTM D 648) | 111.7 | 144.5 | 131.8 |

When the resin was reinforced, the hardness increased and with it the tensile displacement and flex displacement decreased dramatically as the material became more metal-like. Accordingly, the tensile and flex modulus were increased significantly. With glass and sorbent reinforced nylon (without glass reinforcement), the tensile and flex stress was substantially maintained. The important feature and the significance of this finding was that the properties of the sorbent reinforced nylon vary from pure nylon in the same way as does glass reinforced nylon, both in direction and magnitude. In addition, the heat deflection temperature was increased. Heat deflection temperature is a measure of heat resistance. This term is known among those skilled in the art. It is an indicator of the ability of the material to withstand deformation from heat over time. A further implication of the increased heat deflection temperature was an increase in the service temperature of a part molded from the sorbent reinforced resin.

It was also found that structures molded from sorbent reinforced nylon resin (without glass reinforcement) are isotropic as evidenced by the fact that tensile and flex modulus were substantially the same in one direction as another. As further evidence, shrinkage out of a mold is minimal and symmetrical.

EXAMPLE 2

Further experiments were performed using compositions comprising polypropylene, namely Huntsman Polypropylene 6106. This resin was also compatible with refrigerants, as well as with compressor lubricant. It was compounded in a similar fashion as nylon in Example 1, namely: 60% polypropylene resin and 40% molecular sieve Type 4A. The resin was heated above 174° C. The compounded resin had similar advantageous mechanical properties compared to the pure resin, and performs, structurally, close to that of a glass reinforced resin. Its properties are summarized in Table II. The values were determined by the same ASTM standards as provided in Table I.

TABLE II

Properties of Reinforced Polypropylene

| | Material: | | | |
|---|---|---|---|---|
| Property: | PP Neat | Molecular Sieve Reinforced Polypropylene | Glass Bead Reinforced Polypropylene | Glass Fiber Reinforced Polypropylene |
| Loading (%) | 0 | 37.5 | 41.9 | 39.4 |
| Hardness - Shore D | 66.8 | 74.6 | 65.6 | 75.4 |
| Tensile Modulus (psi) | 131242 | 228023 | 159321 | 342977 |
| Tensile Displacement @ Max Load (in.) | 0.330 | 0.137 | 0.274 | 0.222 |

TABLE II-continued

Properties of Reinforced Polypropylene

| Property: | PP Neat | Molecular Sieve Reinforced Polypropylene | Glass Bead Reinforced Polypropylene | Glass Fiber Reinforced Polypropylene |
|---|---|---|---|---|
| Tensile Stress @ Max. Load (psi) | 3583 | 3169 | 2188 | 15996 |
| Flex Modulus (psi) | 113251 | 219377 | 158136 | 737113 |
| Flex Displacement @ Yield (in.) | 0.597 | 0.356 | 0.468 | 0.176 |
| Flex Stress @ Yield (psi) | 14.368 | 14.298 | 9.781 | 60.7 |
| Heat Deflection Temp. (° F.) | 121.3 | 145.1 | 128.8 | n/a |

Reinforcement of polypropylene resulted in increased hardness and increases in tensile and flex modulus. For each of these properties the sorbent alone demonstrated even greater reinforcement effect than glass bead reinforcement. Accordingly, tensile displacement and flex displacement were reduced as the material became more rigid. Again, the effect of the sorbent was directionally the same as, but greater than glass bead reinforcement. Tensile and flex stress were reduced only slightly with sorbent reinforcement. However, the reduction was greater with glass reinforcement. With polypropylene, the reinforcement with sorbent was generally more effective than with glass bead reinforcement. The heat deflection temperature was increased. Here again, a further implication of the increased heat deflection temperature was an increase in the service temperature of a part molded from the sorbent reinforced resin.

Similarly, it was further found that structures molded from sorbent reinforced polypropylene resin were isotropic as evidenced by the fact that tensile and flex modulus were substantially the same in one direction, as another. As further evidence, shrinkage out of a mold was minimal and symmetrical.

EXAMPLE 3

As may be seen in Table III, melt flow was reduced with sorbent reinforced nylon compared with nylon neat (pure polymer) or glass bead reinforced nylon. Nevertheless it was in a workable range and was higher than polypropylene. Melt flow of sorbent reinforced polypropylene was improved relative to polypropylene neat or glass reinforced polypropylene.

TABLE III

Melt Flow Properties of Sorbent Reinforced Polymers

| Melt Flow Index (g/10 min) (ASTM D 1238) | Neat | Molecular Sieve Reinforced | Glass Bead Reinforced |
|---|---|---|---|
| Nylon | 56.3 | 14.7 | 55.5 |
| Polypropylene | 5.3 | 7.3 | 2.1 |

EXAMPLE 4

Moisture adsorption as a percentage of part weight is significant. This may be seen in Table IV. In practice, molecular sieve will adsorb about 25% of its own weight. It is reasonable then to expect a 40% loaded polymer to adsorb 10% of its own weight. In the case of nylon, however, adsorption reaches 13% in a 90% relative humidity (RH) environment, while the capacity is closer to 10% in an 80% RH environment. This was presumably the result of the action of the sorbent coupled with adsorption of some water by the nylon itself. The fact that the body as a whole adsorbs in excess of 10% indicates that the sorbent in addition to reinforcing the nylon was fully functional as a sorbent even though dispersed in the polymer. There was, in effect, a synergistic effect, or a double duty by the sorbent. Table IV shows results of adsorption at 36-38% molecular sieve loading.

TABLE IV

Adsorption Properties of Sorbent Reinforced Polymers

| Moisture Adsorption @ 29° C., 90% r.h. | 2 Days | 10 days | 23 days | 38 Days |
|---|---|---|---|---|
| Molecular Sieve Reinforced Nylon | 5.4% | 12.4% | 13% | 13% |
| Molecular Sieve Reinforced Polypropylene | 1.1% | 2.8% | 4.4% | 5.7% |

Polypropylene is hydrophobic and is thus much slower to adsorb moisture. But it is fully functional as a sorbent while being fully functional as a molding resin.

Additional applications of this invention are numerous. Such applications would include any resin bonded component or structure used in an air conditioning or refrigeration system. As discussed above, examples include J-tubes that are injection molded in halves and welded or possibly injection blow-molded, sleeve liners, coatings for an interior part or shell, co-injection molded composite structures, and insert molded filter-dryer assemblies. Diagnostic applications would include test strip substrates, case or supports for E-trans cases, containers or components of containers for diagnostic products. Pharmaceutical applications would include parts of a tablet container, such as a base, or closure, or the body of the container itself, an insert into a tablet container such as a bottom support or a neck insert to aid in dispensing, a thermoformed sheet or as a layer of a multilayer thermoformable sheet suitable for one-at-a-time or two-at-a-time dose dispensing from a blister or other compartmented package. Monolithic cylindrical canisters for use in pharmaceutical bottles may also be formed from resin bonded sorbent materials, thereby providing a drop-in replacement for hollow canisters filled with particulate sorbent material. Electronics and electro-optical device applications would include complete breather filter bodies, inserts for night vision sensor units, or inserts for rear view camera bodies.

It will be appreciated that there are many other potential applications for a sorbent loaded injection moldable resin in closed systems and sealed packaging applications. It must also be appreciated that a sorbent loaded injection molding resin can also be extruded into a rod or channel or any other shape with a uniform cross-section because extrusion is a less demanding process than injection molding.

The resin bonded sorbents described above and herebelow overcome the drawbacks of the prior art materials. Specifically, the instant invention is less brittle, e.g., parts formed from the resin bonded sorbents are capable of passing drop tests without part failure, the parts adsorb fluid at slower rates thereby extending their useful life and minimizing the effects of manufacturing environments, they can be regenerated slowly and by combining sorbent properties with structural characteristics, the number of parts within an assembly may be reduced, i.e., a cost reduction as one part will serve two purposes. The instant invention resin/sorbent matrices are less expensive to manufacture and use due to the use of conventional resin, reduced processing steps and the use of multi-resin materials which do not create phase boundaries. Additionally, older metal housings can be replaced with resin bonded sorbent housings thereby providing an active barrier against moisture or other fluid ingress, providing far greater design flexibility, weight reduction and cost savings as previously mentioned.

When a circuit board is heated to melt and reflow the solder to secure electrical connections, the board may be subject to damage due to moisture adsorbed within the board material. Thus, in one embodiment, resin bonded sorbents may be used to form a circuit board. A circuit board having a sorbent entrained in the board material will remain dry and greatly reduce or eliminate damage during solder reflow. In a sealed electronic device housing having a circuit board formed from a resin bonded sorbent, other components within the sealed housing will be protected over the service life of the device.

In another embodiment, resin bonded sorbents may be used to form overmolded pressed multiforms. First, a sorbent is formed by pressing, sintering or molding a resin bonded sorbent material. Pressing and molding can be accomplished with heat and/or pressure. Subsequently, the sorbent is overmolded with a structural, protective resin, which at least partially encloses the sorbent. The overmold may include tabs or other features suitable for mounting within or attaching to a sealed electronic or data storage device. As with the examples described above, the sorbent may be any of the desiccant class or volatile adsorbent class chosen to adsorb moisture or other fluids which could damage or limit the service life of the protected device. In this embodiment, the overmolding resin may be any suitable thermoplastic or thermoset resin which has the required properties and is otherwise compatible with the sealed electronic or data storage device being protected.

In yet another embodiment, resin bonded sorbents may be used to form structural components of optical and electro-optical devices. For example, a lens, lens mount, lens retaining ring, aperture, housing, etc. may be formed from a resin bonded sorbent material and thereafter incorporated within an assembly as the pre-existing part was incorporated. Thus, in this embodiment, the resin bonded sorbent will prevent condensation within the assembly which would typically cloud lenses or other optical surfaces thereby degrading of image quality. Furthermore, if the sorbent material is of the indicating type, e.g., color change above a specific moisture content, the condition of the part will be readily apparent in so far as whether the part is still capable of adsorbing. When using indicating sorbent material, the devices which incorporate such material may include a window to allow a user to see, for example, the color change which communicates the need to change the part to the user.

In still another embodiment, resin bonded sorbents may be used to form components that merely fill available empty space while providing sorbent capabilities. Thus, no additional enclosure space is required to include a sorbent in a pre-existing assembly. For example, a hard drive typically has very little space available within its housing, however sorbent capacity is still required to provide a suitable environment for prolonged life of the drive. According to this embodiment, multifunctional sorbents may be incorporated into the interior drive components or provided as an overmolded multiform, as described supra. As with other embodiments, the sorbents may include desiccants, volatile organic adsorbers, volatile acid adsorbers or oxygen adsorbers.

Some electronic devices may be used in exceedingly aggressive environments, e.g., aerospace and aviation applications. Electronic devices are used extensively in avionics and communications systems in aircraft and aerospace applications. Moisture and other volatiles may adversely affect the service life of such devices. Devices such as sensors, transmitters, antennae, radar units, etc. which are externally mounted are particularly at risk from moisture ingress due to temperature and pressure changes leading to evaporation and recondensation of moisture within the housings of such devices. Moreover, internally mounted devices are vulnerable due to variations in temperature as service conditions vary. Thus, resin bonded sorbent articles are quite beneficial when included in these types of devices.

Similarly, automotive electronics are used in environments which may vary in type from a desert to a mountain top to a tundra. These devices may include, for example, backup and night vision cameras and sensing and control circuitry mounted in the exterior, or under the hood of an automobile or truck. By using resin bonded sorbent material to form a housing or internal part, moisture ingress may be prevented or its effects mitigated. Additionally, electronically controlled braking systems can be protected from moisture ingress, as these systems are subject to conditions at extreme temperatures. For example, brake fluid, which is hygroscopic and in contact with several electronic controls, may change from an ambient winter temperature of zero degrees centigrade (0° C.) to three hundred fifty degrees centigrade (350° C.) in a very short period of time under high braking condition, e.g., going down a large hill. Preventing moisture ingress into the brake fluid not only prolongs electronic component service life, but also maintains safer conditions, i.e., as water content increases in brake fluid, its boiling point lowers so that under normal operating conditions the liquid becomes a vapor and braking power is essentially lost. In like fashion, gauges and electronic displays for boats, RVs, ATVs and military rough terrain vehicles are also exposed to aggressive environments where the incorporation of the instant invention would be quite beneficial. In particular, marine and submersible applications expose electronics to electrolyte solutions where corrosion is accelerated. In like fashion, automotive and marine devices benefit by incorporating resin bonded sorbent articles within the device.

Surveillance and security devices, e.g., light/motion/heat sensors and security cameras, must operate reliably in a wide range of temperature and humidity. For example, an external security camera mounted on a bank in Buffalo, N.Y. can see temperatures as high as thirty seven degrees centigrade (37° C.) and as low as minus twenty three degrees centigrade (−23° C.), while experiencing relative humidity levels from ninety five percent (95%) down to twenty percent (20%). Thus, using the instant invention resin bonded sorbents to form a device housing or internal component is particularly advantageous for extending service life of such devices.

Another aggressive environment where electronic devices are prevalent is in hazardous chemical production and use. Sensors, controls and switch gear must operate in these environments while being protected from hazardous and/or corrosive vapors. Thus, using an appropriate sorbent, e.g., desiccant, activated carbon, zeolites, clays and organic sorbents, in a resin bonded sorbent housing or internal component of such devices will prolong its service life. Similarly, industrial use personal computers (PCs) and programmable logic controllers (PLCs) must operate in harsh industrial environments, e.g., high humidity. Hence, forming a housing or internal component of these devices from the instant invention resin bonded sorbents will prolong the service life of these PCs and PLCs.

Yet another aggressive environment where electronic devices are becoming more prevalent is inside the human body, i.e., implantable and/or attachable electronic medical devices. These types of devices must function continuously and reliably in a moist, saline environment, or in other words, an environment where corrosion conditions are optimal. An appropriate resin bonded sorbent housing, or internal resin bonded sorbent part, can maintain dryness and enhance longevity and reliability of these devices. In addition to the implantable and attachable medical devices, medical diagnostic equipment must also be maintained in reliable working condition, i.e., dry electronics. Thus, using the instant invention to form a housing or internal component is particularly advantageous.

Mobile and stationary telecommunication devices are also exposed to adverse and aggressive environments. Terminals and switch gear would have longer service life and lower maintenance if the interior of their housings were kept dry. Thus, a housing or internal part formed from the instant invention would keep the device dry, thereby minimizing current leakage and shorts, inhibiting dendrite formation and electrolytic/chemical corrosion. In addition to moisture adsorption, suitable sorbents may be included to address other volatiles present within the housing.

Other electronic devices, e.g., solar panels or day/night sensors, present other problems to overcome. Commercial photovoltaic devices consist of flat, nearly all glass panels which are coated with a moisture sensitive photoactive substance. The panels are sealed to each other in the manner of a thermo-pane window. Sealants may be used around the perimeter, or the panels may be mounted in a frame. Additionally, ports and openings into the panel for electrical connections must be sealed. Frame materials or fitments for electrical connections may be made from resin bonded sorbent which can simultaneously provide the mechanical strength and sorbent properties required to contain and protect moisture sensitive, fragile solar panels.

Radio frequency identification (RFID) devices are made from semiconductor chips and associated circuitry. Circuit boards may be used, however imprinted circuitry is more prevalent. RFID devices, and in particular organic RFID devices, are often used in adverse environments where they may degrade due to moisture, oxygen or volatile chemicals. Thus, RFID devices may be improved by manufacturing support structures or housings from polymeric resins with properties enhanced by sorbent additives capable of extending the life of RFID devices, e.g., desiccants or oxygen adsorbents.

Light emitting diodes (LEDs) and liquid crystal diodes (LCDs) are made from materials which are moisture sensitive. In particular, organic LEDs and LCDs are highly moisture sensitive. Sorbent materials are added to displays to improve and extend service life, usually in thin film or sheet form. According to the instant invention, a structural support or sealant material can be made from resin bonded sorbents, thereby providing moisture protection, i.e., extending service life, while also providing the structural, mounting or sealing functionality of a pre-existing component. In like fashion, flexible electronic displays are highly moisture sensitive. Chromophores used in their construction are moisture sensitive and therefore can be stabilized by incorporating a resin bonded sorbent within the displays.

Even traditional lighting devices, for example, household lighting and automobile headlamps, will benefit by including the instant invention. Condensation on lenses may be prevented, thereby prolonging bulb and service life of such devices, while eliminating loss of reflected light.

Solid state surface mount electronic devices housed in plastic enclosures are considered nonhermetic due to the moisture permeability of the plastic. The basic issue is vapor pressure change of water during solder reflow cycle causing damage, which may lead to delamination, cracking, leaking and "popcorning". Currently, low moisture sensitivity is achieved by the choice of materials, design of package and good processes. Resin bonded sorbent enclosures will inhibit moisture ingress, effectively making a hermetic seal until the sorbent becomes saturated. Examples of such devices include, but are not limited to, radio frequency, wireless, local area network (LAN) and broadband devices, as well as electronic chip mountings and packaging.

As described supra, imaging devices present issues different than part degradation. The presence of moisture combined with a change in temperature can cause condensation on a lens or window of an imaging device. Condensation quickly degrades image quality and may render imaging devices nonfunctional. Such devices are known to require moisture control when the service environment is moist and subject to temperature fluctuation. Thus, an article made from resin bonded sorbent, e.g., lens retaining ring, aperture, housing, etc., may be incorporated within the assembly thereby providing sorbent capabilities as well as structural support. Such optical devices may be used for sighting and/or sensing an object, for example, target acquisition and guidance sensors and systems. In these systems, lasers and other sensing devices form a crucial part of the target acquisition and guidance systems, thus peek optical performance is necessary, i.e., no condensation on optical surfaces.

In addition to sorbent capabilities, resin bonded sorbent material may be blended with other materials, e.g., static dissipative (conductive) material, thereby providing multifunction capability, for example, moisture control and antistatic properties. Thus, these materials may be used in any of the above described electronic applications by adsorbing moisture while dissipating static charges.

Figure 10:
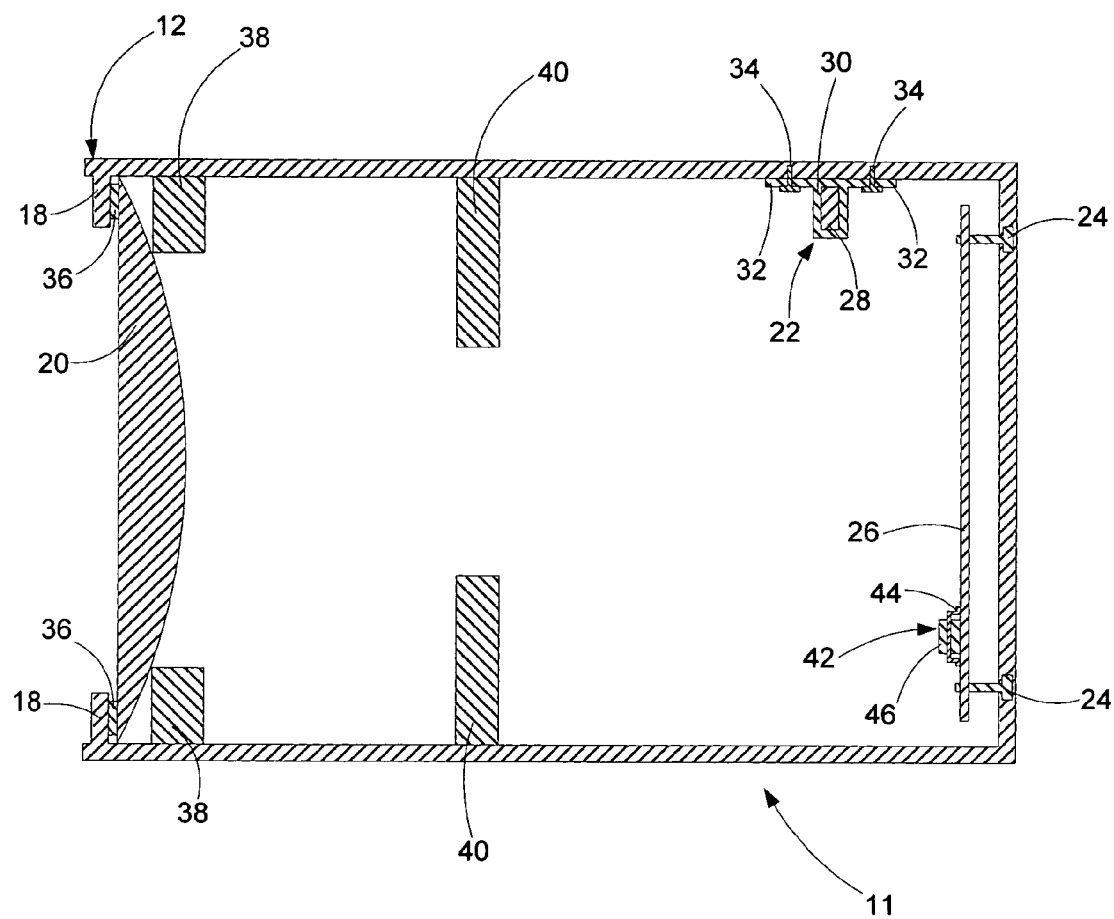
FIG. 10 shows a cross sectional view of an embodiment of the present invention.

FIG. 10 shows a cross sectional view of an embodiment of the present invention, device 11. Device 11 includes housing 12 which includes first and second walls 14 and 16, respectively, and shoulder 18. As described supra, housing 12 may be formed from a resin bonded sorbent thereby slowing or preventing the ingress of fluid. Shoulder 18 provides a seat for lens 20, while first wall 14 provides a mounting location for sorbent article 22 and second wall 16 provides a mounting location for stand-offs 24 which fixedly secure circuit board 26 to housing 12. Sorbent article 22 includes sorbent 28 enclosed within overmold resin 30. Overmold resin 30 includes tabs 32 which are used to hold sorbent article 22 to first wall 14 via fasteners 34. As described above, circuit board 26 may also be formed from a resin bonded sorbent thereby providing sorbent capability within housing 12. Device 11 further includes gasket 36 and retaining ring 38. Gasket 36 is disposed between shoulder 18 and lens 20, while retaining ring 38 provides a positive force in the direction of gasket 36, thereby compressing gasket 36. The compression of gasket 36 seals housing 12 and prevents the ingress of fluids therein. Additionally, gasket 36, retaining ring 38 and/or lens 20 may be formed from a resin bonded sorbent material, which would provide a greater level of protection from fluid ingress. Device 11 further includes aperture 40 disposed between lens 20 and circuit board 26. Aperture 40 may also be formed from a resin bonded sorbent thereby providing further sorbent capacity. Although aperture 40 is shown as being formed from a resin bonded sorbent material, one of ordinary skill in the art will recognize that other articles may be formed from such materials and incorporated within device 11, for example, baffles, fasteners or stand-offs. Surface mount device 42 is fixedly secured to circuit board 26 via contacts 44. Surface mount device 42 further includes enclosure 46. Typically, surface mount device 42 would not be considered hermetically sealed as the enclosure materials are permeable to some fluids. Thus, by forming enclosure 46 from a resin bonded sorbent material, surface mount device 42 can be hermetically sealed.

As one of ordinary skill in the art will recognize, device 11 and the components contained therein are not limited to the particular embodiment shown in FIG. 10. For example, housing 12 may be a fully sealed container having no lens 20 and/or no aperture 40. Thus, it is within the spirit and scope of the invention that device 11 can comprise at least one article formed from resin bonded sorbent material which is selected from the group consisting of a lens, circuit board, housing, case, frame, support structure, mount structure, retaining structure, seal material, solid state surface mount device, electronic chip packaging, telecommunications terminal, telecommunications switch, a data storage device, electronic device, electro-optical device, scope, sensor, transmitter, antenna, radar unit, photovoltaic device, radio frequency identification device, light emitting diode, liquid crystal diode, semiconductor enclosure, imaging device, sighting device, cellular phone, target acquisition and guidance sensor, implantable electronic medical device, attached electronic medical device, mobile telecommunications device, stationary telecommunications device, automobile sensing circuit, automobile control circuit, braking control system, hazardous chemical sensor, hazardous chemical control, gauge, electronic display, personal computer, programmable logic unit, medical diagnostic equipment, light sensor, motion sensor, heat sensor, security camera, flexible electronic device, lighting fixture, marine gauge, marine light, external aircraft sensing device, external aircraft monitoring device, external aircraft measuring device, power tool sensing device, power tool sighting device, power tool measuring device, laser and combinations thereof.

Although the present invention has been particularly described in conjunction with specific preferred embodiments, it is evident that many alternatives, modifications, and variations will be apparent to those skilled in the art. It is therefore contemplated that the appended claims will embrace any such alternatives, modifications, and variations as falling within the true scope and spirit of the present invention.

What is claimed is:

1. An article comprising a resin bonded sorbent material for at least one fluid in combination with a second article needing protection from said at least one fluid, said resin bonded sorbent material comprising a blend of a resin and a sorbent for said at least one fluid and said at least one fluid is destructive to said second article, wherein all of said resin is homogeneous resin, said sorbent comprises a plurality of particles uniformly dispersed within said resin so that each particle of said plurality of particles is fully surrounded by said resin.

2. The article of claim 1 wherein said resin is a thermoplastic resin and said sorbent is selected from the group consisting of a molecular sieve, silica gel, an ion exchange resin, activated carbon, activated alumina, clay, particulate metal, a salt comprising a $CO_2$ releasing anion and mixtures thereof.

3. The article of claim 1 wherein said sorbent material comprises a zeolite.

4. The article of claim 1 wherein said sorbent is a molecular sieve and said resin is selected from the group consisting of polyamide, polyolefin, styrenic polymer, polyester and homogeneous mixtures thereof.

5. The article of claim 1 wherein said resin is an ethylene or a propylene-containing homopolymer or copolymer.

6. The article of claim 1 wherein said resin bonded sorbent material is formed with the aid of a coupling agent or a compatibilizing agent, wherein the coupling agent or compatibilizing agent is chemically compatible with the resin and improves adhesion or coupling with the sorbent.

7. The article of claim 6 wherein said coupling or compatibilizing agent is selected from the group consisting of reactive and non-reactive agents.

8. The article of claim 7 wherein said compatibilizing agent is selected from the group consisting of a metal, an acrylate, stearate, block copolymer, maleate, epoxy, silane, titanate and mixtures thereof.

9. The article of claim 1 wherein said resin bonded sorbent material comprises from about five percent (5%) to about fifty-five percent (55%) sorbent and from about forty-five percent (45%) to about ninety-five percent (95%) resin.

10. The article of claim 1 wherein said resin bonded sorbent material comprises from about twenty-five percent (25%) to about fifty-five percent (55%) sorbent and from about forty-five percent (45%) to about seventy-five percent (75%) resin.

11. The article of claim 1 wherein said resin bonded sorbent material comprises from about thirty-five percent (35%) to about forty-two percent (42%) sorbent and from about fifty-eight percent (58%) to about sixty-five percent (65%) resin.

12. The article of claim 1 wherein said article is selected from the group consisting of a lens, circuit board, housing, case, frame, support structure, mount structure, retaining structure, seal material, solid state surface mount device, electronic chip packaging, telecommunications terminal, telecommunications switch, a data storage device, electronic device, electro-optical device, scope, sensor, transmitter, antenna, radar unit, photovoltaic device, radio frequency identification device, light emitting diode, liquid crystal diode, semiconductor enclosure, imaging device, sighting device, cellular phone, target acquisition and guidance sensor, implantable electronic medical device, attached electronic medical device, mobile telecommunications device, stationary telecommunications device, automobile sensing circuit, automobile control circuit, braking control system, hazardous chemical sensor, hazardous chemical control, gauge, electronic display, personal computer, programmable logic unit, medical diagnostic equipment, light sensor, motion sensor, heat sensor, security camera, flexible electronic device, lighting fixture, marine gauge, marine light, external aircraft sensing device, external aircraft monitoring device, external aircraft measuring device, power tool sensing device, power tool sighting device, power tool measuring device, laser and combinations thereof.

13. The article of claim 1 wherein said sorbent comprises a particulate sorbent formed by pressing, sintering, extruding or molding, and said sorbent further comprises at least a partial overmold of said resin.

14. The article of claim 13 further comprising means for mounting within or attaching to said second article.

15. The article of claim 14 wherein said means for mounting or attaching comprises at least one tab.

16. The article of claim 13 wherein said molding comprises the use of heat and/or pressure.

17. The article of claim 1 further comprising an electrically conductive material.

18. The article of claim 1 wherein the resin bonded sorbent material comprises a single resin.

19. The article of claim 1 wherein the at least one fluid is selected from the group consisting of a caustic fluid, an organic solvent fluid, an inorganic solvent fluid, a Group VI fluid and a Group VII fluid.

20. The article of claim 1 wherein said blend of said resin and sorbent is formed by a twin screw extruder.

21. An article comprising a resin bonded sorbent material for at least one fluid, said resin bonded sorbent material comprising a blend of a resin and a sorbent for said at least one fluid, said resin bonded sorbent material having a vapor permeability greater than the vapor permeability of water through high density polyvinylidene chloride and less than the vapor permeability of water through water swellable water insoluble hydroxycellulos, wherein said sorbent comprises a plurality of particles uniformly dispersed within said resin so that each particle of said plurality of particles is fully surrounded by said resin.

22. The article of claim 21 wherein said article is selected from the group consisting of a lens, circuit board, housing, case, frame, support structure, mount structure, retaining structure, seal material, solid state surface mount device, electronic chip packaging, telecommunications terminal, telecommunications switch, a data storage device, electronic device, electro-optical device, scope, sensor, transmitter, antenna, radar unit, photovoltaic device, radio frequency identification device, light emitting diode, liquid crystal diode, semiconductor enclosure, imaging device, sighting device, cellular phone, target acquisition and guidance sensor, implantable electronic medical device, attached electronic medical device, mobile telecommunications device, stationary telecommunications device, automobile sensing circuit, automobile control circuit, braking control system, hazardous chemical sensor, hazardous chemical control, gauge, electronic display, personal computer, programmable logic unit, medical diagnostic equipment, light sensor, motion sensor, heat sensor, security camera, flexible electronic device, lighting fixture, marine gauge, marine light, external aircraft sensing device, external aircraft monitoring device, external aircraft measuring device, power tool sensing device, power tool sighting device, power tool measuring device, laser and combinations thereof.

23. The article of claim 21 wherein said sorbent comprises a particulate sorbent formed by pressing, sintering, extruding or molding, and said sorbent further comprises at least a partial overmold of said resin.

24. The article of claim 23 further comprising means for mounting within or attaching to a structural component.

25. The article of claim 24 wherein said means for mounting or attaching comprises at least one tab.

26. The article of claim 23 wherein said molding comprises the use of heat and/or pressure.

27. The article of claim 21 further comprising an electrically conductive material.

28. The article of claim 21 wherein the resin bonded sorbent material comprises a single resin.

29. The article of claim 21 wherein the at least one fluid is selected from the group consisting of a caustic fluid, an organic solvent fluid, an inorganic solvent fluid, a Group VI fluid and a Group VII fluid.

30. The article of claim 21 wherein said blend of said resin and sorbent is formed by a twin screw extruder.

31. A method for protecting a first article from at least one fluid damaging said first article comprising the steps of:
  i) forming a resin bonded sorbent material, said resin bonded sorbent material comprising a blend of a resin and a sorbent for said at least one fluid, wherein said sorbent comprises a plurality of particles uniformly dispersed within said resin so that each particle of said plurality of particles is fully surrounded by said resin;
  ii) forming a second article from said resin bonded sorbent material; and,
  iii) incorporating said second article into said first article.

32. The method of claim 31 wherein said second article is selected from the group consisting of a lens, circuit board, housing, case, frame, support structure, mount structure, retaining structure, seal material, solid state surface mount device, electronic chip packaging, telecommunications terminal, telecommunications switch, a data storage device, electronic device, electro-optical device, scope, sensor, transmitter, antenna, radar unit, photovoltaic device, radio frequency identification device, light emitting diode, liquid crystal diode, semiconductor enclosure, imaging device, sighting device, cellular phone, target acquisition and guidance sensor, implantable electronic medical device, attached electronic medical device, mobile telecommunications device, stationary telecommunications device, automobile sensing circuit, automobile control circuit, braking control system, hazardous chemical sensor, hazardous chemical control, gauge, electronic display, personal computer, programmable logic unit, medical diagnostic equipment, light sensor, motion sensor, heat sensor, security camera, flexible electronic device, lighting fixture, marine gauge, marine light, external aircraft sensing device, external aircraft monitoring device, external aircraft measuring device, power tool sensing device, power tool sighting device, power tool measuring device, laser and combinations thereof.

33. The method of claim 31 wherein said sorbent material comprises a particulate sorbent formed by pressing, sintering, extruding or molding, and said sorbent material comprises at least a partial overmold of said resin.

34. The method of claim 33 wherein said second article further comprises means for mounting within or attaching to said first article.

35. The method of claim 34 wherein said means for mounting or attaching is at least one tab.

36. The method of claim 33 wherein said molding is performed with heat and/or pressure.

37. The method of claim 31 wherein said second article further comprises an electrically conductive material.

38. The method of claim 31 wherein said resin bonded sorbent material comprises a single resin.

39. The article of claim 31 wherein the at least one fluid is selected from the group consisting of a caustic fluid, an organic solvent fluid, an inorganic solvent fluid, a Group VI fluid and a Group VII fluid.

40. The article of claim 31 wherein said blend of said resin and sorbent is formed by a twin screw extruder.

* * * * *